United States Patent
Huang et al.

(10) Patent No.: US 12,085,459 B2
(45) Date of Patent: Sep. 10, 2024

(54) PRESSURE DETECTION MODULE AND ELECTRONIC DEVICE

(71) Applicant: SHENZHEN GOODIX TECHNOLOGY CO., LTD., Shenzhen (CN)

(72) Inventors: Ruilang Huang, Shenzhen (CN); Peng Xiao, Shenzhen (CN); Jun Cai, Shenzhen (CN); Xinglang Xu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 399 days.

(21) Appl. No.: 17/481,041

(22) Filed: Sep. 21, 2021

(65) Prior Publication Data
US 2022/0252469 A1    Aug. 11, 2022

Related U.S. Application Data

(63) Continuation of application No. PCT/CN2021/094710, filed on May 19, 2021.

(30) Foreign Application Priority Data

Feb. 9, 2021    (WO) ................ PCT/CN2021/076377

(51) Int. Cl.
*G01L 1/14*    (2006.01)
*G01D 5/24*    (2006.01)

(52) U.S. Cl.
CPC ................ *G01L 1/144* (2013.01); *G01D 5/24* (2013.01)

(58) Field of Classification Search
CPC .. G01L 1/144; G01L 1/14; G01D 5/24; H03K 2217/960755; H03K 2217/9651;
(Continued)

(56) References Cited

U.S. PATENT DOCUMENTS

| 4,587,378 A | 5/1986 | Moore |
| 4,725,817 A | 2/1988 | Wihlborg |

(Continued)

FOREIGN PATENT DOCUMENTS

| CN | 101490642 A | 7/2009 |
| CN | 206348812 U | 7/2017 |

(Continued)

OTHER PUBLICATIONS

Luque A et al: "Capacitive pressure sensor fabricated using printed circuit board techniques", Electron Devices (CDE), 2011 Spanish Conference On, IEEE, Feb. 8, 2011 (Feb. 8, 2011), pp. 1-4, XP032014251, D O I: 10.110 9/SC E D .2011.5 744235, ISBN: 978-1-4244-7863-7.

(Continued)

*Primary Examiner* — Francis C Gray
(74) *Attorney, Agent, or Firm* — Emerson, Thomson & Bennett, LLC; Roger D. Emerson; Matt J. Wilson

(57) ABSTRACT

A pressure detection module and an electronic device are provided. The pressure detection module includes: a first electrode, a second electrode, a first circuit board, a second circuit board, and at least two solder fixing parts. A first surface of the first circuit board is fixed to an inner surface of a force input area of the housing. A second surface of the first circuit board is fixed to a first surface of the first electrode. A first surface of the second circuit board is fixed to a second surface of the second electrode. Two end sides of the second surface of the first circuit board and two end sides of the first surface of the second circuit board are disposed opposed to each other through the at least two solder fixing parts. Thereby, the pressure detection module does not require a bracket and has a small thickness.

20 Claims, 5 Drawing Sheets

(58) Field of Classification Search
CPC .. H03K 17/975; H03K 17/962; G06F 3/0414; G06F 3/044
See application file for complete search history.

(56) References Cited

U.S. PATENT DOCUMENTS

| | | | |
|---|---|---|---|
| 10,757,491 B1 | 8/2020 | Jackson et al. | |
| 2006/0001655 A1 | 1/2006 | Tanabe | |
| 2008/0018608 A1 | 1/2008 | Serban et al. | |
| 2008/0018611 A1* | 1/2008 | Serban | H03K 17/975 345/173 |
| 2012/0228109 A1 | 9/2012 | Wang et al. | |
| 2013/0001550 A1 | 1/2013 | Seeger et al. | |
| 2013/0076375 A1* | 3/2013 | Hanumanthaiah | H03K 17/955 324/661 |
| 2013/0120005 A1 | 5/2013 | Magnusson et al. | |
| 2016/0124530 A1 | 5/2016 | Stern | |
| 2017/0102809 A1 | 4/2017 | Son et al. | |
| 2019/0297408 A1 | 9/2019 | Mohammadi et al. | |
| 2019/0311172 A1 | 10/2019 | Kang et al. | |
| 2020/0037058 A1 | 1/2020 | Ueda | |
| 2020/0100013 A1 | 5/2020 | Harjee et al. | |

FOREIGN PATENT DOCUMENTS

| | | | |
|---|---|---|---|
| CN | 206805504 | | 12/2017 |
| CN | 207249680 U | | 4/2018 |
| CN | 108702567 | | 10/2018 |
| CN | 109792573 | | 5/2019 |
| CN | 110114738 | | 8/2019 |
| CN | 110603815 | | 12/2019 |
| CN | 110780769 | | 2/2020 |
| CN | 110944258 | | 3/2020 |
| CN | 110972020 | | 4/2020 |
| CN | 210725282 | | 6/2020 |
| CN | 212208267 | | 12/2020 |
| CN | 212208267 U | | 12/2020 |
| CN | 212425432 U | | 1/2021 |
| CN | 214702567 U | * | 11/2021 |
| EP | 2041641 A2 | | 4/2009 |
| EP | 2546730 A2 | | 1/2013 |
| EP | 2041641 B1 | | 4/2014 |
| KR | 20160033986 A | | 3/2016 |
| WO | WO2008009687 | | 1/2008 |

OTHER PUBLICATIONS

"Fabrication Process for PCBMEMS Capacitive Pressure Sensors Using the Cu Layer to Define the Gap", IEEE Sensors Journal, IEEE, USA, vol. 16, No. 5, Mar. 1, 2016 (Mar. 1, 2016), pp. 1151-1157, XP01 1 59851 1, ISSN: 1530-437X, DOI: 10.1109/JSEN.2015.2503405, [retrieved on Feb. 8, 2016].

* cited by examiner

PRESSURE DETECTION MODULE AND ELECTRONIC DEVICE

CROSS-REFERENCE TO RELATED APPLICATIONS

This application is a continuation of International Application No. PCT/CN2021/094710 filed on May 19, 2021, which claims the priority to the International Application No. PCT/CN2021/076377 filed on Feb. 9, 2021, the disclosures of which are hereby incorporated by reference in their entireties.

TECHNICAL FIELD

The present disclosure relates to the field of electronic technology, and in particular to a pressure detection module and an electronic device.

BACKGROUND

Electronic devices such as earphones may detect whether they are pressed through pressure detection modules installed inside, so as to perform operation control corresponding to the pressing. For example, a pressure detection module installed in an earphone determines whether the earphone is pressed, thereby controlling the playback of music in the earphone. A pressure detection module is usually disposed in a narrow space of an electronic device, and how to reduce an internal space of the electronic device occupied by the pressure detection module, especially a thickness of the electronic device, has become an urgent technical problem to be solved.

SUMMARY

In view of this, one of the technical problems solved by embodiments of the present disclosure is to provide a pressure detection module and an electronic device to partially or completely solve the technical problems existing in the prior art.

In a first aspect, an embodiment of the present disclosure provides a pressure detection module. The pressure detection module is disposed on an inner surface of a housing of an electronic device, and the pressure detection module includes: a first electrode, a second electrode, a first circuit board, a second circuit board, and at least two solder fixing parts for fixing the first circuit board and the second circuit board; a first surface of the first circuit board is fixed to an inner surface of a force input area of the housing, a second surface of the first circuit board is fixed to a first surface of the first electrode, and a first surface of the second circuit board is fixed to a second surface of the second electrode; two end sides of the second surface of the first circuit board and two end sides of the first surface of the second circuit board are disposed opposed to each other through the at least two solder fixing parts, and a compressible insulating layer is provided between a second surface of the first electrode and a first surface of the second electrode so that the first electrode and the second electrode form a capacitor; and the force input area of the housing drives the first electrode to move towards the second electrode based on received external pressure, so that the capacitance between the first electrode and the second electrode changes to determine a pressure detection result on the external pressure.

In a second aspect, an embodiment of the present disclosure provides an electronic device, having at least one the above pressure detection module inside a housing of the electronic device.

The pressure detection module and the electronic device provided by the embodiments of the present disclosure, since the first surface of the first electrode included in the pressure detection module is fixed to the inner surface of the force input area of the housing, the second surface of the first circuit board is fixed to the first surface of the first electrode, the first surface of the second circuit board is fixed to the second surface of the second electrode, the two end sides of the second surface of the first circuit board and the two end sides of the first surface of the second circuit board are disposed opposed to each other through the solder fixing parts, and the compressible insulating layer is provided between the second surface of the first electrode and the first surface of the second electrode so that the first electrode and the second electrode form the capacitor. When the force input area of the housing receives external pressure, the first electrode is driven to move towards the second electrode, and the pressure detection result on the external pressure is determined based on the change in the capacitance between the first electrode and the second electrode. Therefore, the pressure detection module according to an embodiment of the present disclosure only needs to be installed on the inner surface of the force input area of the housing to achieve pressure detection, no bracket is required, and the thickness of the pressure detection module is small, thereby facilitating installation of other elements inside the electronic device. In addition, the relative arrangement of the first electrode and the second electrode does not need to occupy an area of the two, which improves an accuracy of sensing the external pressure through the first electrode and the second electrode, and provides a better adhesion effect of relatively fixedly disposing the first circuit board and the second circuit board.

BRIEF DESCRIPTION OF THE DRAWINGS

Hereinafter, some specific embodiments of the embodiments of the present disclosure will be described in detail in an exemplary but not restrictive method with reference to the accompanying drawings. The same reference numerals in the accompanying drawings indicate the same or similar components or parts. Those skilled in the art should appreciate that these accompanying drawings are not necessarily drawn to scale. In the accompanying drawings.

DETAILED DESCRIPTION OF EMBODIMENTS

In order to solve the above problems, embodiments of the present disclosure provide a pressure detection module and an electronic device. A specific implementation of the embodiments of the present utility model will be further described below in conjunction with the accompanying drawings of the embodiments of the present utility model.

Figure 1:
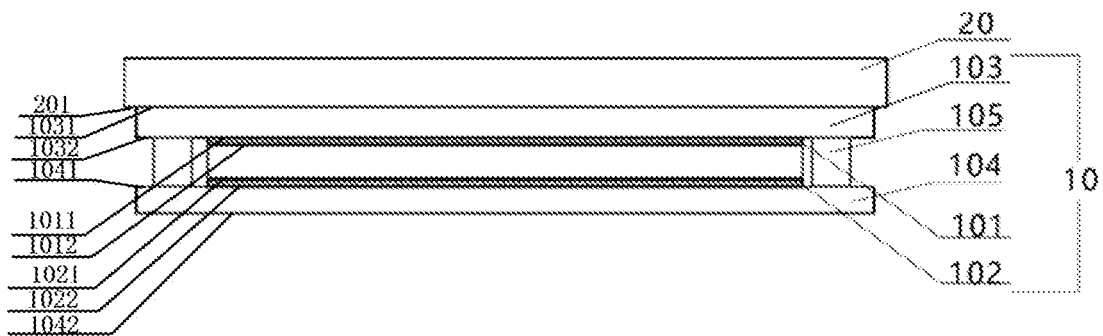
FIG. 1 is a structural diagram of a pressure detection module provided by an embodiment of the present disclosure.

An embodiment of the present disclosure provides a pressure detection module, as shown in FIG. 1, FIG. 1 is a structural diagram of a pressure detection module provided by Embodiment 1 of the present disclosure. A pressure detection module 10 is disposed on an inner surface 201 of a housing 20 of an electronic device, and the pressure detection module 10 includes: a first electrode 101, a second electrode 102, a first circuit board 103, a second circuit board 104, and at least two solder fixing parts 105 for fixing the first circuit board and the second circuit board.

A first surface 1031 of the first circuit board 103 is fixed to an inner surface 201 of a force input area 21 of the housing 20, a second surface 1032 of the first circuit board 103 is fixed to a first surface 1011 of the first electrode 101, and a first surface 1041 of the second circuit board 104 is fixed to a second surface 1022 of the second electrode 102.

Two end sides of the second surface 1032 of the first circuit board 103 and two end sides of the first surface 1041 of the second circuit 104 board are disposed opposed to each other through the solder fixing parts 105, and a compressible insulating layer is provided between a second surface 1012 of the first electrode 101 and a first surface 1021 of the second electrode 102 so that the first electrode 101 and the second electrode 102 form a capacitor.

The force input area of the housing 20 drives the first electrode 101 to move towards the second electrode 102 based on received external pressure, so that the capacitance between the first electrode 101 and the second electrode 102 changes to determine a pressure detection result on the external pressure.

Specifically, the force input area of the housing 20 is an area of any shape. The force input area may use any marking to indicate that a user may apply pressure in this area. A position of a center of the force input area corresponds to a position of a center of the first electrode, so that the user drives the first electrode to move towards the second electrode through the external pressure applied by the force input area.

Specifically, the compressible insulating layer is air.

The embodiment of the present disclosure is based on the above arrangement and the compressible insulating layer is air, so as to reduce an assembly difficulty and reduce production costs.

When the force input area of the housing 20 receives an external force and deforms, the center of the force input area deforms the most, and the center of the force input area corresponds to the center of the first electrode 101. When the force input area of the housing 20 receives the external force, the first electrode 101 fixed to the housing 20 deforms with the deformation of the housing 20, the deformation of the first electrode 101 is consistent with that of the housing 20, and the second electrode 102 is fixed to the second circuit board 104, the two end sides of the second circuit board 104 are fixedly disposed to the first circuit board 103 through the solder fixing parts, and there is the compressible insulating layer between the first electrode 101 and the second electrode 102, therefore, the second electrode 102 deforms following deformation of the second circuit board 104. Since a deformation displacement in a pressing center is larger than that of the two ends, that is, a deformation displacement of the first electrode 101 is larger than that of the second electrode 102, a distance between the first electrode 101 and the second electrode 102 changes, resulting in a change in the capacitance. Based on the change in the capacitance, the pressure detection result on the external pressure may be determined.

Specifically, the two end sides of the second surface 1032 of the first circuit board 103 refer to portions not fixed to the first electrode and located on both sides of the first electrode; the two end sides of the first surface 1041 of the second circuit board 104 refer to portions not fixed to the second electrode and located on both sides of the second electrode.

The pressure detection module according to the embodiment of the present disclosure only needs to be installed on the inner surface of the force input area of the housing to achieve pressure detection. There is no need for a bracket and a thickness of the pressure detection module is reduced, thereby facilitating installation of other elements inside the electronic device, and facilitating reducing interference effects between the pressure detection module and other electronic components in a miniaturized electronic device. In addition, the two end sides of the second surface of the first circuit board and the two end sides of the first surface of the second circuit board in the embodiment of the present disclosure are disposed opposed to each other through the solder fixing parts, so that the first electrode on the second surface of the first circuit board and the second electrode on the first surface of the second circuit board are disposed opposed to each other, do not occupy an area of the first electrode and the second electrode, and only occupy a small area of the first circuit board and the second circuit board, which is beneficial to provide a larger first electrode and second electrode on the pressure detection module, further improve an accuracy of sensing the external pressure through the first electrode and the second electrode, making it easier to assemble elements and saving costs. In addition, the embodiment of the present disclosure provides a better adhesion effect of relatively fixedly disposing the first circuit board and the second circuit board through the solder fixing parts, so that when the electronic device is not subjected to external pressure, a relative position of the first electrode on the first circuit board and the second electrode on the second circuit board is more stable and reliable, which is also beneficial for the pressure detection module to be installed in the housing of the electronic device as a whole. Moreover, the solder fixing parts do not need to be glued, the solder fixing parts are not easy to age, and a production process of the solder fixing parts adopts a surface mount technology, which is convenient for automation and may save manpower. The solder fixing parts are more stable and reliable than glue connection, which is more conducive to improving the accuracy and consistency of pressure detection. Further, an adhesion effect of the solder fixing parts is better than an adhesion effect of glue or a double-sided tape, so that when the same adhesion effect is required, smaller solder fixing parts may be used, so as to reduce space occupied by the solder fixing parts and increase the area of the first electrode and the second electrode, to improve a signal volume and the accuracy of pressure detection.

Figure 2:
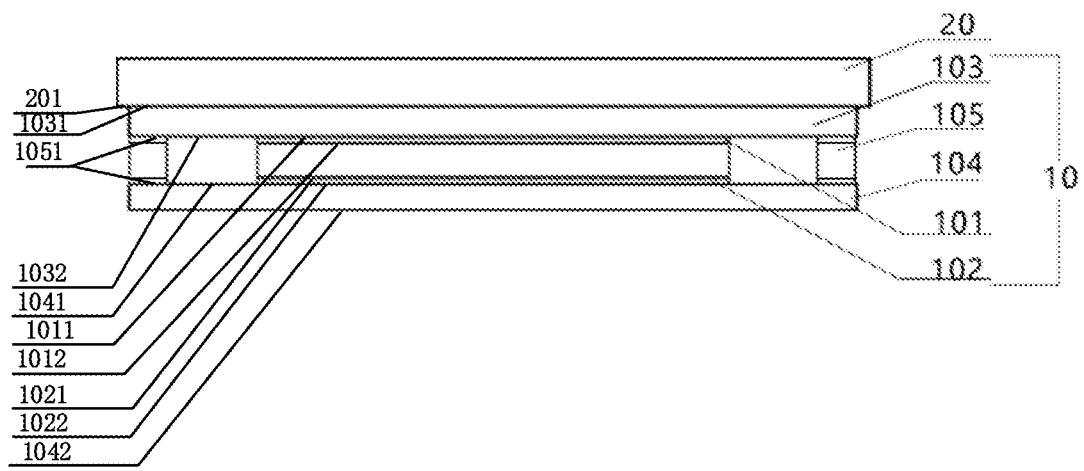
FIG. 2 is a structural diagram of another pressure detection module provided by an embodiment of the present disclosure.

Specifically, referring to FIG. 2, the solder fixing parts 105 are provided on edge sides of the first circuit board 103 and the second circuit board 104 away from the first electrode 101 and the second electrode 102.

The embodiment of the present disclosure is based on the above arrangement, and providing the solder fixing parts 105 on the edge sides away from the first electrode 101 and the second electrode 102 can further avoid influence of the solder fixing parts 105 on the first electrode 101 and the second electrode 102, and improve the accuracy of sensing the external pressure through the first electrode 102 and the second electrode 103. Especially in small electronic devices such as earphones, the distance between the first electrode and the second electrode is very short and the area of the first electrode and the second electrode is very small, which may cause a capacitance signal volume to be small, so that a backend detection circuit cannot detect a capacitance signal or a detected signal is very weak. Therefore, the present embodiment may make the first electrode and the second electrode in the pressure detection module in a small headphone space be set larger, thereby increasing the signal volume of the capacitance signal between the first electrode and the second electrode, in order to help improve the accuracy of pressure detection.

Specifically, positions of the solder fixing parts 105 on one end side of the first circuit board 103 and the second circuit board 104 are disposed to be symmetrical with positions of the solder fixing parts 105 on the other end side of the first circuit board 103 and the second circuit board 104; and/or, the number of the solder fixing parts 105 located on one end side of the first circuit board and the second circuit board is the same as the number of the solder fixing parts located on the other end side of the first circuit board 103 and the second circuit board 104.

The embodiment of the present disclosure is based on the above arrangement and the positions of the solder fixing parts 105 are symmetrically disposed or the number is symmetrically set, which can provide a better adhesion effect of relatively fixedly disposing the first circuit board 103 and the second circuit board 104.

Specifically, a height of the solder fixing parts 105 is greater than or equal to 0.05 mm to less than or equal to 0.15 mm.

The embodiment of the present disclosure is based on the above arrangement and the height of the solder fixing parts 105, which may ensure that a detected pressure signal reaches a certain volume of signal, so as to avoid undetected signals or weak detected signals that affect the accuracy of pressure detection. It may also reduce a volume and thickness of the pressure detection module, simplify a manufacturing process and improve a consistency and yield of the product, which is more conducive to miniaturization of the electronic device.

Specifically, the solder fixing parts 105 have pads 1051 which are in contact with the first circuit board 103 and pads 1051 which are in contact with the second circuit board 104, and the pads 1051 are in a rectangle shape with a single side greater than or equal to 0.3 mm.

The embodiment of the present disclosure is based on the above arrangement and an area of the pads 1051 can achieve a good fixing effect between the first circuit board 103 and the second circuit board 104.

Specifically, the number of the solder fixing parts 105 on each end side is two or three, to ensure the good fixing effect between the first circuit board 103 and the second circuit board 104 while avoiding occupying too much area of the first circuit board 103 and the second circuit board 104.

Figure 3:
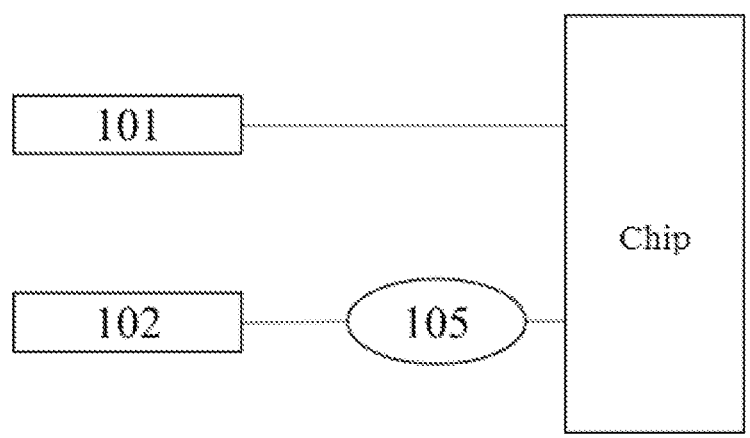
FIG. 3 is a structural diagram of yet another pressure detection module provided by an embodiment of the present disclosure.

In a specific implementation of the present disclosure, referring to FIG. 3, the second electrode 102 is electrically connected to a chip through the solder fixing parts 105, so that the solder fixing parts 105 may achieve adhesion and fixing while conducting electrical connection, in order to further save an area occupied by the second circuit board 104. In addition, wiring may be reduced, thereby reducing interference of wiring to the electronic device.

Figure 4:
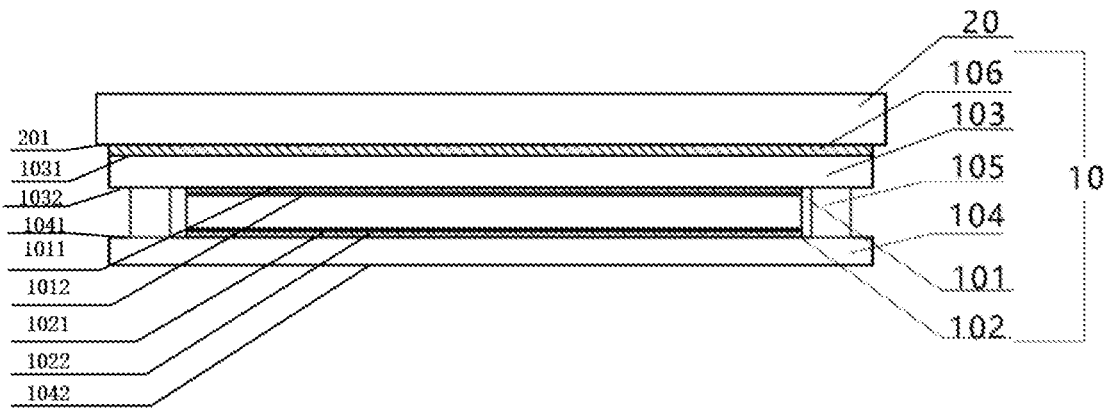
FIG. 4 is a structural diagram of yet another pressure detection module provided by an embodiment of the present disclosure.

In a specific implementation of the embodiment of the present disclosure, referring to FIG. 4, the pressure detection module 10 further includes: a first adhesion layer 106.

The first surface 1031 of the first circuit board 103 is fixed to the inner surface 201 of the force input area 21 of the housing 20 through the first adhesion layer 106.

In the embodiment of the present disclosure, the first circuit board is adhered to the inner surface 201 of the force input area 21 of the housing 20 through the first adhesion layer, which makes installation easier.

Specifically, the first adhesion layer 106 is a layered structure with adhesion on both upper and lower surfaces thereof, so that adhesion between the first circuit board 103 and the inner surface 201 of the force input area 21 of the housing 20 can be easily achieved.

In order to achieve a more convenient and low-cost installation, the first adhesion layer 106 is a double-sided tape.

In order to reduce a thickness of the first adhesion layer as much as possible while achieving an adhesion effect of the first adhesion layer, so as to occupy a smaller internal space of the electronic device, a thickness of the double-sided tape is less than or equal to 0.15 mm.

In order to reduce the thickness of the first adhesion layer as much as possible while achieving the adhesion effect, the thickness of the double-sided tape is 0.1 mm.

In another specific implementation of the embodiment of the present disclosure, in order that the first electrode is better adhered to the second surface of the first circuit board, the first circuit board may be a rigid printed circuit board; and/or in order that the second electrode is better adhered to the first surface of the second circuit board, the second circuit board may be a rigid printed circuit board.

Figure 5:
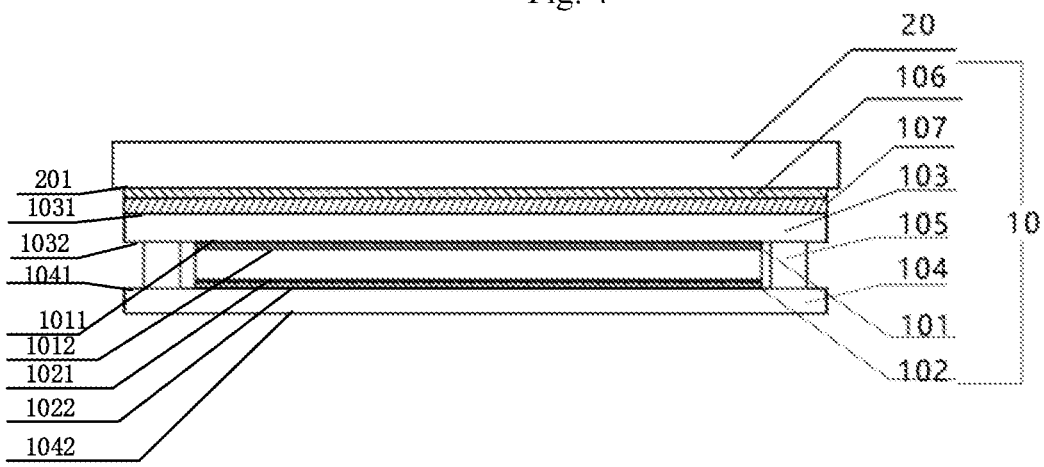
FIG. 5 is a structural diagram of yet another pressure detection module provided by an embodiment of the present disclosure.

In another specific embodiment of the present disclosure, referring to FIG. 5, the pressure detection module further includes: a first stiffener 107, and the first stiffener 107 is fixed on the first surface 1031 of the first circuit board 103.

In the embodiment of the present disclosure, the first stiffener 107 is provided on the first surface 1031 of the first circuit board 103, so that the pressure detection module may be disposed as a whole inside the housing of the electronic device, so that the pressure detection module provided by the present embodiment may be suitable for electronic devices with non-detachable housings, for example, suitable for a structure in which a pull rod of the earphone is a cylindrical whole, thereby improving convenience of installing the pressure detection module on the electronic device. A supporting function of the first stiffener also enables the first circuit board to have better flatness.

Therefore, when the pressure detection module without a first stiffener is installed in a pull rod of an electronic device such as earphone (that is, a rod of the earphone), the housing of the pull rod may be disassembled, that is, the housing of the pull rod may be divided into an upper housing and a lower housing, the pressure detection module is first disposed inside the lower housing of the pull rod, and then the upper housing of the pull rod is buckled on the lower housing. For the pressure detection module with the first stiffener, because the first stiffener increases strength, there is no need to disassemble the housing of the pull rod, and the whole pressure detection module may be directly disposed inside the cylindrical housing.

Specifically, the first stiffener is made of an insulating material, so that the pressure detection module provided in the embodiment of the present disclosure may achieve pressure detection and touch detection at the same time.

Figure 6:
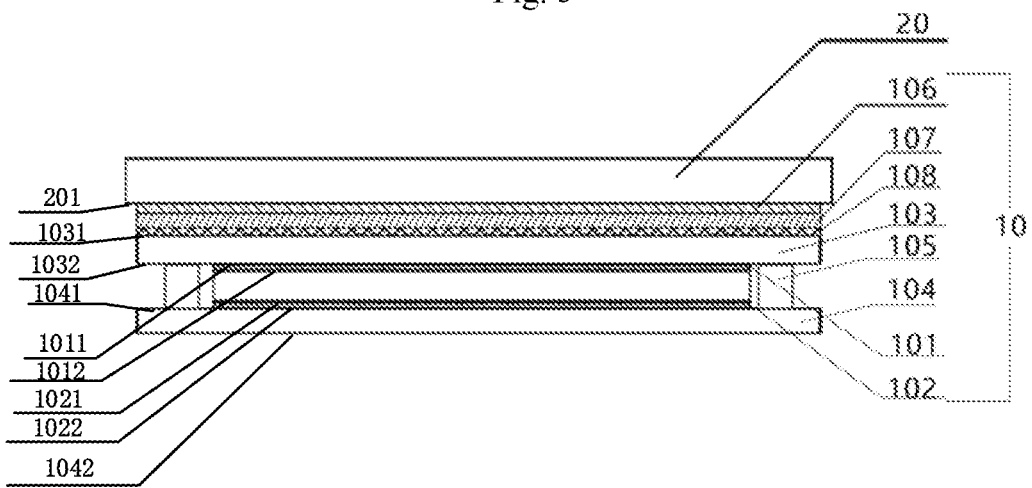
FIG. 6 is a structural diagram of yet another pressure detection module provided by an embodiment of the present disclosure.

In yet another specific implementation of the present disclosure, referring to FIG. 6, the pressure detection module 10 further includes: a first stiffened laminated layer 108, and the first stiffener 107 is fixed on the first surface 1031 of the first circuit board 103 through the first stiffened laminated layer 108.

In the embodiment of the present disclosure, the first stiffener is fixed on the first surface of the first circuit board through the first stiffened laminated layer, which improves fitness and flatness between the first stiffener and the first surface of the first circuit board.

In order to achieve a stiffening effect while minimizing a thickness of the first stiffener 107 and the first stiffened laminated layer 108, so as to occupy a smaller internal space of the electronic device, a total thickness of the first stiffener 107 and the first stiffened laminated layer 108 is less than or equal to 0.2 mm.

In order to achieve the best stiffening effect while minimizing the thickness of the first stiffener 107 and the first stiffened laminated layer 108, the total thickness of the first stiffener 107 and the first stiffened laminated layer 108 is 0.2 mm.

Figure 7:
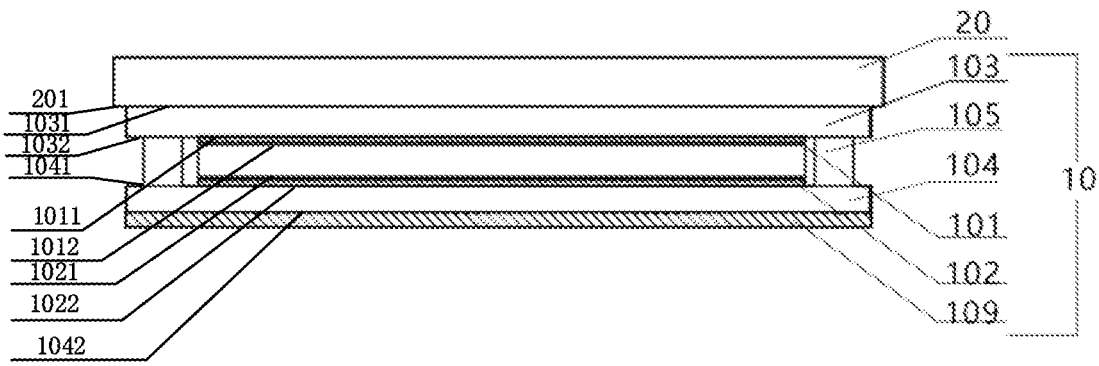
FIG. 7 is a structural diagram of yet another pressure detection module provided by an embodiment of the present disclosure.

In yet another specific implementation of the present disclosure, referring to FIG. 7, the pressure detection module 10 further includes: a second stiffener 109, and the second stiffener 109 is fixed on a second surface 1042 of the second circuit board 104.

In the embodiment of the present disclosure, the second stiffener is provided on the second surface of the second circuit board, so that the second circuit board is more closely adhered to the second surface of the second electrode. A supporting function of the second stiffener also enables the second electrode to have better flatness.

Specifically, the second stiffener 109 is a steel plate, which can provide better support, better flatness, and simple and convenient manufacturing process.

Figure 8:
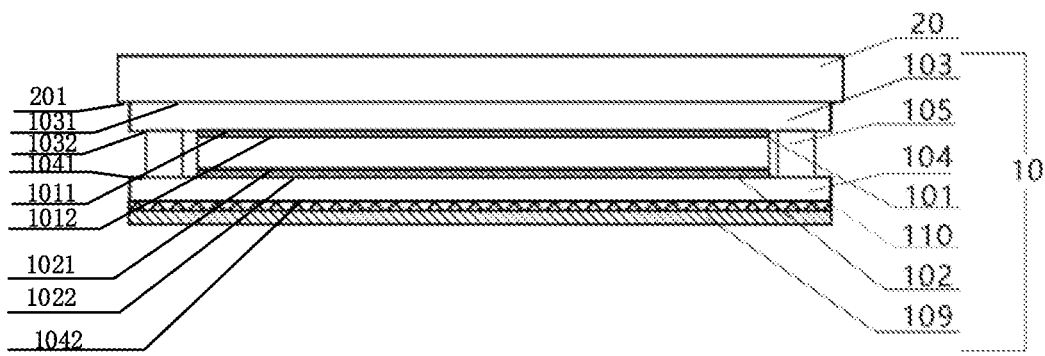
FIG. 8 is a structural diagram of yet another pressure detection module provided by an embodiment of the present disclosure.

In yet another specific implementation of the present disclosure, referring to FIG. 8, the pressure detection module further includes: a second stiffened laminated layer 110, and the second stiffener 109 is fixed on the second surface of the second circuit board 104 through the second stiffened laminated layer 110.

In the embodiment of the present disclosure, the second stiffener is fixed on the second surface of the second circuit board through the second stiffened laminated layer, which improves fitness and flatness between the second stiffener and the second circuit board.

In order to achieve a stiffening effect while minimizing a thickness of the second stiffener 109 and the second stiffened laminated layer 110, so as to occupy a smaller internal space of the electronic device, a total thickness of the second stiffener 109 and the second stiffened laminated layer 110 is less than or equal to 0.15 mm.

In order to achieve the best stiffening effect while minimizing the thickness of the second stiffener 109 and the second stiffened laminated layer 110, the total thickness of the second stiffener 109 and the second stiffened laminated layer 110 is 0.15 mm.

Figure 9:
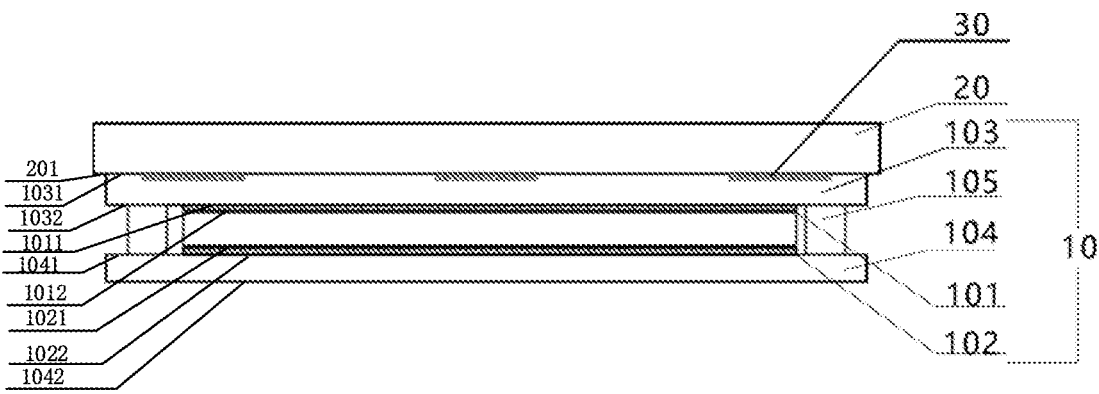
FIG. 9 is a structural diagram of yet another pressure detection module provided by an embodiment of the present disclosure.

In another specific implementation of the embodiment of the present disclosure, referring to FIG. 9, for all technical solutions that do not have the first stiffener 107, at least one touch sensor 30 is provided on the first surface 1031 of the first circuit board 103.

Figure 10:
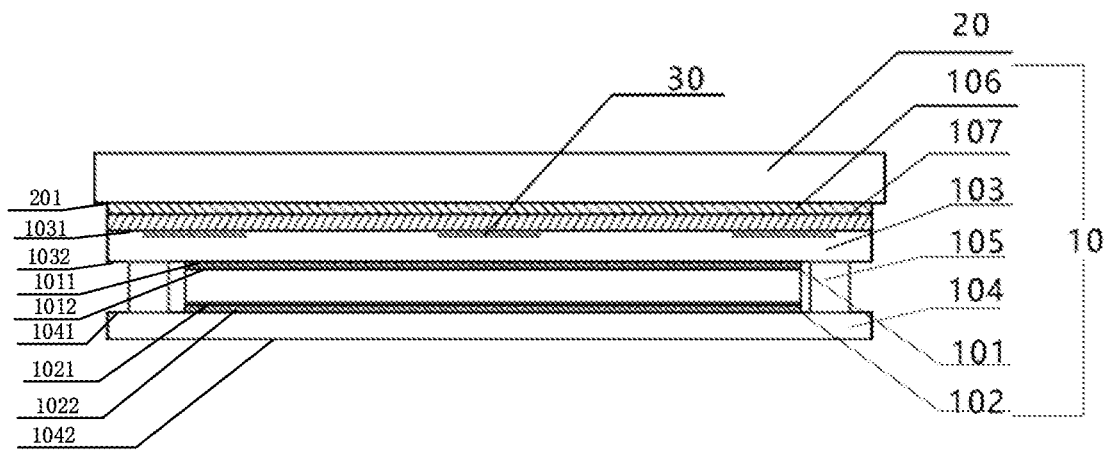
FIG. 10 is a structural diagram of yet another pressure detection module provided by an embodiment of the present disclosure.

Referring to FIG. 10, for a technical solution that has the first stiffener 107, at least one touch sensor 30 is provided on the first surface 1031 of the first circuit board 103, and the first stiffener 107 is an insulated stiffener, so that the touch sensor can detect the user's touch.

Since the first surface of the first circuit board in the embodiment of the present disclosure has at least one touch sensor, and the second surface is fixed on the first surface of the first electrode, the embodiment of the present disclosure installs both the touch sensor and the first electrode on the first circuit board, so that the first electrode for detecting pressure and the touch sensor for detecting touch are both located on the same side of the housing and at the same position on the same side (that is, the housing where the force input area is located). Further, the first circuit board may simultaneously sense the user's touch and pressure applied by the user through the force input area of the housing. The structure of the first circuit board is simple, an installation process thereof may also be simplified, and the simple structure and the simplified process may further improve the consistency of the product and improve the yield of the product. The embodiment of the present disclosure may further save the internal space of the electronic device, and facilitate the installation of other internal elements.

Specifically, a length of the first circuit board is greater than or equal to 5 mm, so that the at least one touch sensor on the first circuit board may better realize touch sensing.

In yet another specific embodiment of the present disclosure, an embodiment of the present disclosure provides an electronic device, and the electronic device has the pressure detection module in any one of the above embodiments inside a housing thereof.

In the embodiment of the present disclosure, a thickness of the housing is less than or equal to 1 mm. Therefore, the present embodiment can also reduce a weight of the housing as much as possible while meeting the strength of the housing.

Specifically, the electronic device includes: a wireless Bluetooth earphone, a smart glass, etc. The pressure detection module according to the embodiment of the present disclosure is installed in a pull rod of the wireless Bluetooth earphone or smart glass, and the pull rod is a rod-shaped part connected with an earpiece or a lens.

Specifically, the electronic device is an earphone or a smart glass, and the pressure detection module is detachably disposed inside a housing of a pull rod of the earphone or smart glass.

Figure 11:
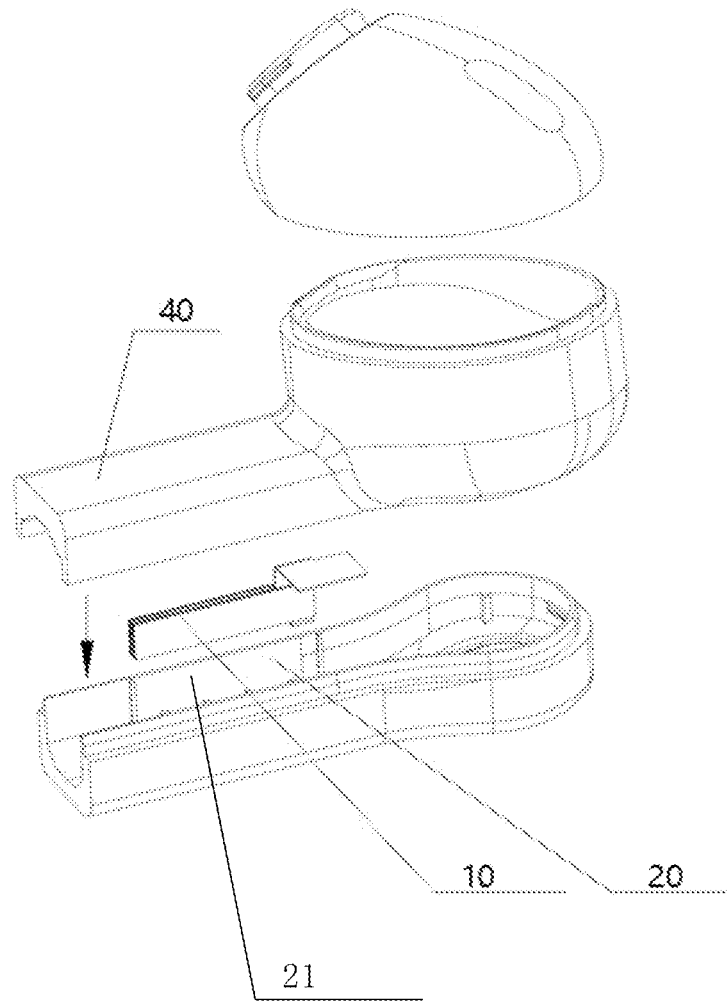
FIG. 11 is a schematic diagram of installation of an earphone provided by an embodiment of the present disclosure.
Figure 12:
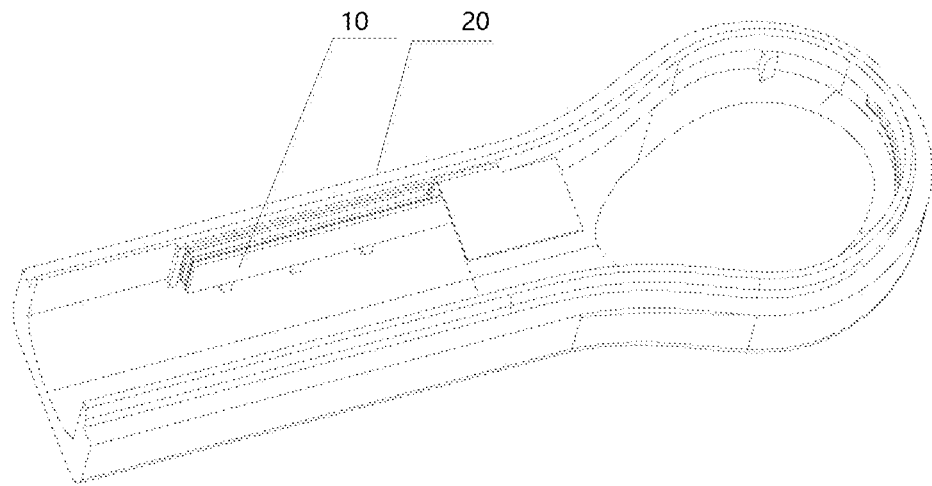
FIG. 12 is a schematic diagram of an internal structure of an earphone provided by an embodiment of the present disclosure.

For example, referring to FIGS. 11 and 12, when the electronic device is a wireless Bluetooth earphone, the pressure detection module 10 is disposed in a pull rod 40.

In addition, referring to FIGS. 11 and 12, the pressure detection module is detachably disposed in the pull rod 40.

Alternatively, the pressure detection module is detachably disposed in a middle section of the pull rod 40, facilitating replacement and maintenance of the pressure detection module.

Figure 13:
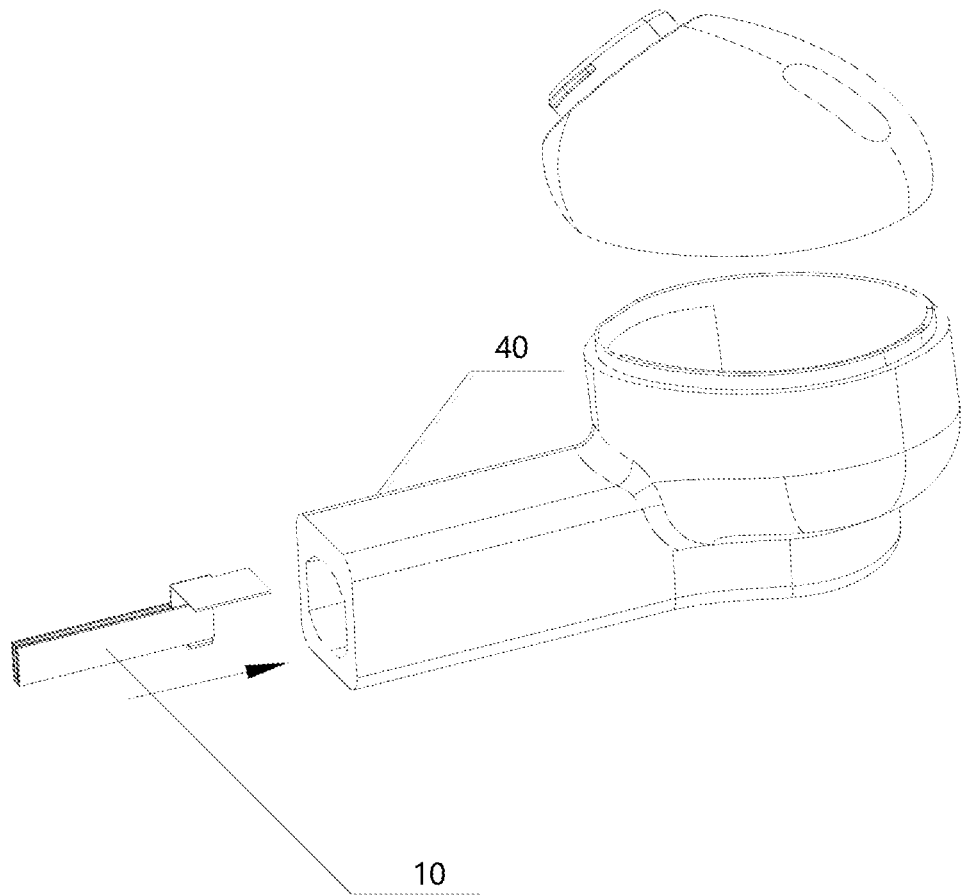
FIG. 13 is a schematic diagram of installation of another earphone provided by an embodiment of the present disclosure.

Therefore, referring to FIG. 13, the pressure detection module 10 with the first stiffener is suitable for being non-detachably installed inside the housing of the pull rod 40 of the wireless Bluetooth earphone as a whole, without disassembling the pull rod 40, which is convenient for installation, replacement and maintenance.

The pressure detection module according to the embodiment of the present disclosure only needs to be installed on the inner surface of the force input area of the housing to achieve pressure detection. There is no need for a bracket and the thickness of the pressure detection module is reduced, thereby facilitating the installation of other elements inside the electronic device, and facilitating reducing interference effects between the pressure detection module and other electronic components in a miniaturized electronic device. In addition, the two end sides of the second surface of the first circuit board and the two end sides of the first surface of the second circuit board in the embodiment of the present disclosure are disposed opposed to each other through the solder fixing parts, so that the first electrode on the second surface of the first circuit board and the second electrode on the first surface of the second circuit board are disposed opposed to each other, do not occupy an area of the first electrode and the second electrode, and only occupy a small area of the first circuit board and the second circuit board, thereby improving the accuracy of sensing the external pressure through the first electrode and the second electrode, making it easier to assemble elements and saving costs. In addition, the embodiment of the present disclosure provides a better adhesion effect of relatively fixedly disposing the first circuit board and the second circuit board, the solder fixing parts do not need to be glued, the solder fixing parts are not easy to age, and the production process adopts the surface mount technology, which is convenient for automation and may save manpower.

It should be noted that the terms "including," "comprising," or any other variation thereof are intended to encompass non-exclusive inclusion, such that a process, method, product, or device that includes a series of elements includes not only those elements but also other elements not explicitly listed, or those that are inherent to such process, method, product, or device. Without more restrictions, elements defined by the sentence "including a . . . " do not exclude the existence of other identical elements in the process, method, product or device including the said elements.

The embodiments in this specification are described in a progressive method, and the same or similar parts between the embodiments may refer to each other. Each embodiment focuses on the differences from other embodiments. Specifically, for the system embodiment, since it is basically similar to the method embodiment, the description thereof is relatively simple. For related details, reference may be made to the part of description in the method embodiment.

The above description is merely embodiments of the present disclosure and is not intended to limit the present disclosure. For those skilled in the art, the present disclosure may have various modifications and changes. Any modification, equivalent replacement, improvement, etc. made within the spirit and principle of the present disclosure shall be included in the scope of the claims of the present disclosure.

What is claimed is:

1. A pressure detection module, wherein the pressure detection module is disposed inside a housing of an electronic device and disposed on an inner surface of the housing, and the pressure detection module comprises: a first electrode, a second electrode, a first circuit board, a second circuit board, and at least two solder fixing parts;

a first surface of the first circuit board is fixed to an inner surface of a force input area of the housing, a second surface of the first circuit board is opposite to the first surface of the first circuit board and is fixed to a first surface of the first electrode, and a first surface of the second circuit board faces the second surface of the first circuit board and is fixed to a second surface of the second electrode, wherein the force input area of the housing is an area of the house on which external pressure can be applied;

two end sides of the second surface of the first circuit board and two end sides of the first surface of the second circuit board are disposed opposed to each other through the at least two solder fixing parts, and a compressible insulating layer is provided between a second surface of the first electrode which is opposite to the first surface of the first electrode and a first surface of the second electrode which is opposite to the second surface of the second electrode so that the first electrode and the second electrode form a capacitor; and the force input area of the housing is configured to deform upon receiving the external pressure to cause a distance between the first electrode and the second electrode changes, so that a capacitance between the first electrode and the second electrode changes to determine a pressure detection result on the external pressure.

2. The pressure detection module according to claim 1, wherein positions of the solder fixing parts on one end side of the first circuit board and the second circuit board are disposed to be symmetrical with positions of the solder fixing parts on the other end side of the first circuit board and the second circuit; and/or, a number of the solder fixing parts located on one end side of the first circuit board and the second circuit board is the same as a number of the solder fixing parts located on the other end side of the first circuit board and the second circuit board.

3. The pressure detection module according to claim 1, wherein a height of the solder fixing parts is greater than or equal to 0.05 mm and less than or equal to 0.15 mm.

4. The pressure detection module according to claim 1, wherein the solder fixing parts have pads which are in contact with the first circuit board and pads which are the second circuit board, and the pads are in a rectangle shape with a single side greater than or equal to 0.3 mm.

5. The pressure detection module according to claim 1, wherein the second electrode is electrically connected to a chip through the solder fixing parts.

6. The pressure detection module according to claim 1, wherein the pressure detection module further comprises: a first adhesion layer, and the first surface of the first circuit board is fixed to the inner surface of the force input area of the housing through the first adhesion layer.

7. The pressure detection module according to claim 1, wherein the first circuit board and/or the second circuit board are rigid printed circuit boards.

8. The pressure detection module according to claim 1, wherein the first circuit board is a flexible printed circuit board, and the pressure detection module further comprises: a first stiffener, and
the first stiffener is fixed on the first surface of the first circuit board.

9. The pressure detection module according to claim 8, wherein the pressure detection module further comprises: a first stiffened laminated layer, and
the first stiffener is fixed on the first surface of the first circuit board through the first stiffened laminated layer.

10. The pressure detection module according to claim 9, wherein a total thickness of the first stiffener and the first stiffened laminated layer is less than or equal to 0.2 mm.

11. The pressure detection module according to claim 1, wherein the second circuit board is a flexible printed circuit board, and the pressure detection module further comprises: a second stiffener, and
the second stiffener is fixed on a second surface of the second circuit board.

12. The pressure detection module according to claim 11, wherein the pressure detection module further comprises: a second stiffened laminated layer, and
the second stiffener is fixed on the second surface of the second circuit board through the second stiffened laminated layer.

13. The pressure detection module according to claim 12, wherein a total thickness of the second stiffener and the second stiffened laminated layer is less than or equal to 0.15 mm.

14. The pressure detection module according to claim 1, wherein the compressible insulating layer is air.

15. The pressure detection module according to claim 1, wherein at least one touch sensor is provided on the first surface of the first circuit board.

16. The pressure detection module according to claim 15, wherein a length of the first circuit board is less than or equal to 10 mm.

17. The pressure detection module according to claim 8, wherein at least one touch sensor is provided on the first surface of the first circuit board, and the first stiffener is an insulated stiffener.

18. An electronic device, having at least one pressure detection module inside a housing of electronic device, wherein the pressure detection module is disposed on an inner surface of a housing of an electronic device, and the pressure detection module comprises: a first electrode, a second electrode, a first circuit board, a second circuit board, and at least two solder fixing parts;
a first surface of the first circuit board is fixed to an inner surface of a force input area of the housing, a second surface of the first circuit board is opposite to the first surface of the first circuit board and is fixed to a first surface of the first electrode, and a first surface of the second circuit board faces the second surface of the first circuit board and is fixed to a second surface of the second electrode, wherein the force input area of the housing is an area of the house on which external pressure can be applied;
two end sides of the second surface of the first circuit board and two end sides of the first surface of the second circuit board are disposed opposed to each other through the at least two solder fixing parts, and a compressible insulating layer is provided between a second surface of the first electrode which is opposite to the first surface of the first electrode and a first surface of the second electrode which is opposite to the second surface of the second electrode so that the first electrode and the second electrode form a capacitor; and
the force input area of the housing is configured to deform upon receiving the external pressure to cause a distance between the first electrode and the second electrode changes, so that a capacitance between the first electrode and the second electrode changes to determine a pressure detection result on the external pressure.

19. The electronic device according to claim 18, wherein the electronic device is an earphone or a smart glass, and the pressure detection module is detachably disposed inside a housing of a pull rod of the earphone or smart glass.

20. The electronic device according to claim 19, wherein the pressure detection module is detachably disposed in a middle section of the pull rod.

* * * * *